United States Patent
Tsai

(10) Patent No.: US 10,811,258 B1
(45) Date of Patent: Oct. 20, 2020

(54) METHOD FOR IMPROVING THE QUALITY OF A HIGH-VOLTAGE METAL OXIDE SEMICONDUCTOR

(71) Applicant: UNITED MICROELECTRONICS CORP., Hsin-Chu (TW)

(72) Inventor: Tsung-Hsun Tsai, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/450,984

(22) Filed: Jun. 24, 2019

(51) Int. Cl.
| | |
|---|---|
| *H01L 21/033* | (2006.01) |
| *H01L 29/78* | (2006.01) |
| *H01L 21/28* | (2006.01) |
| *H01L 29/66* | (2006.01) |
| *H01L 29/06* | (2006.01) |

(52) U.S. Cl.
CPC .... *H01L 21/0337* (2013.01); *H01L 21/28123* (2013.01); *H01L 29/66681* (2013.01); *H01L 29/7816* (2013.01); *H01L 29/0653* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 5,821,603 A * | 10/1998 | Puntambekar | C23C 16/345 257/640 |
| 8,524,605 B1 * | 9/2013 | Chen | H01L 21/0337 438/696 |
| 9,165,765 B1 * | 10/2015 | Raley | H01L 21/0338 |
| 9,613,808 B1 | 4/2017 | Ye | |
| 2003/0221703 A1 | 12/2003 | Oguro | |
| 2005/0008976 A1 * | 1/2005 | Sakamizu | G03F 7/0046 430/311 |
| 2013/0196512 A1 * | 8/2013 | Koide | H01L 21/0206 438/745 |
| 2017/0044470 A1 | 2/2017 | Bruce | |
| 2018/0138049 A1 * | 5/2018 | Ko | H01L 21/02164 |
| 2018/0151346 A1 * | 5/2018 | Blanquart | C23C 16/45523 |
| 2019/0097052 A1 * | 3/2019 | Chu | H01L 29/0847 |

* cited by examiner

*Primary Examiner* — Evren Seven
(74) *Attorney, Agent, or Firm* — Winston Hsu

(57) ABSTRACT

The present invention provides a method for improving the quality of a high-voltage metal oxide semiconductor (HV MOS), the method includes: firstly, a substrate is provided, next, a hard mask layer is formed on the substrate, an oxygen plasma treatment is then performed to the hard mask layer, so as to form an oxide layer on the hard mask layer. Afterwards, a patterned photoresist layer is formed on the oxide layer, and a first cleaning process is performed to a top surface of the oxide layer after the patterned photoresist layer is formed, wherein the first cleaning process comprises rinsing the oxide layer with carbonated water. Next, a first etching process is performed to remove parts of the hard mask layer, and the patterned photoresist layer is then removed. Afterwards, a second etching process is performed, to remove the oxide layer.

14 Claims, 5 Drawing Sheets

METHOD FOR IMPROVING THE QUALITY OF A HIGH-VOLTAGE METAL OXIDE SEMICONDUCTOR

BACKGROUND OF THE INVENTION

1. Field of the Invention

The present invention relates to a method for forming a high voltage metal oxide semiconductor (HV MOS), and more particularly, to a method of improving the surface quality of a dielectric layer before the high voltage gate is formed.

2. Description of the Prior Art

With advances in technology, the related industry and technology of semiconductor integrated circuit (IC) has been grown rapidly. High voltage metal-oxide-semiconductor (HV MOS) transistor devices have been broadly utilized in CPU power supply systems, power management systems, AC/DC converters, LCD/plasma TV drivers, automobile electronic components, PC peripheral devices, small DC motor controllers, PC peripheral devices, small DC motor controllers, and other consumer electronic devices due to being capable of enduring the high voltage provided by the electrical power system and having switching characterize together.

In another aspect, as the size of device shrinks continuously, metal gate has gradually replaced the conventional polycrystalline silicon material as being the control electrode configured with high dielectric constant dielectric layer. However, the issues of process integration occur when the metal gates are applied to some specific devices, such as memory devices and high voltage devices.

SUMMARY OF THE INVENTION

The present invention provides a method for improving the quality of a high-voltage metal oxide semiconductor (HV MOS), the method includes: firstly, a substrate is provided, next, a hard mask layer is formed on the substrate, an oxygen plasma treatment is then performed to the hard mask layer, so as to form an oxide layer on the hard mask layer. Afterwards, a patterned photoresist layer is formed on the oxide layer, and a first cleaning process is performed to a top surface of the oxide layer after the patterned photoresist layer is formed, wherein the first cleaning process comprises rinsing the oxide layer with carbonated water. Next, a first etching process is performed to remove parts of the hard mask layer, and the patterned photoresist layer is then removed. Afterwards, a second etching process is performed, to remove the oxide layer.

In the present invention, a method for improving the quality of a high-voltage metal oxide semiconductor (HV MOS) is provided. Specifically, the present invention provides a method of improving the surface quality of a dielectric layer (i.e. the hard mask layer) before the high voltage gate (HVG) is formed. More detail, the method of the present invention performs the first oxygen plasma treatment (to form an oxide layer), the first cleaning process (rinsing with carbonated water), the second cleaning process (rinsing with deionized water) and the etching process (dipping in the DHF solution, and reduce the dipping time to less than 480 seconds) in sequence, therefore, the negative charges on the exposed surface of the semiconductor component is gradually reduced during the execution of the above steps. As a result, after the DHF etching, the problem of uneven distribution of the residual solution on the semiconductor surface can be avoided, thereby improve the quality of the HV MOS.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic diagrams illustrating a manufacturing method of a high-voltage metal-oxide-semiconductor (HV MOS) transistor device according to a first embodiment of the present invention, wherein FIGS. 1-7 are cross-sectional view diagrams illustrating the HV MOS transistor device according to the first embodiment of the present invention.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Refer to FIGS. 1-7, which are schematic diagrams illustrating a manufacturing method of a high-voltage metal-oxide-semiconductor (HV MOS) transistor device according to a first embodiment of the present invention, wherein FIGS. 1-7 are cross-sectional view diagrams illustrating the HV MOS transistor device according to the first embodiment of the present invention.

Figure 1:
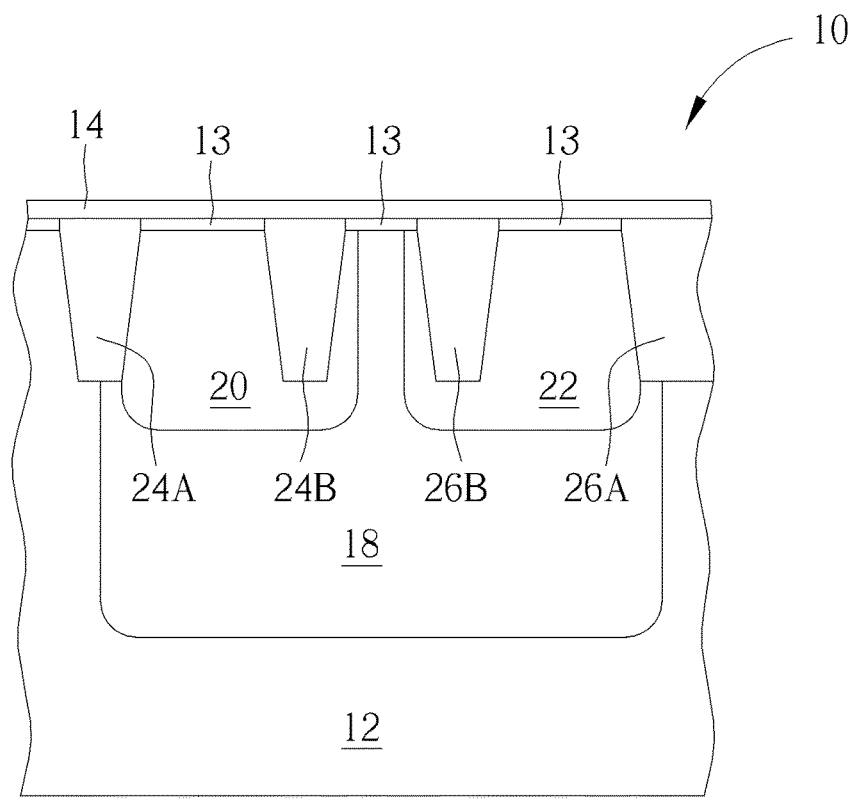

As shown in FIG. 1, first, a HV MOS transistor 10 is provided, for example, an operation voltage of the HV MOS transistor 10 of the present invention is greater than 5 volts (v), such as several tens of volts, and/or a break down voltage of the HV MOS transistor is greater than 10 volts, such as several tens of volts or even several hundreds of volts. The HV MOS transistor 10 includes a semiconductor substrate 12 and a hard mask layer 14. In the present embodiment, the semiconductor substrate 12 may include a silicon substrate, an epitaxial silicon substrate, a silicon germanium substrate, a silicon carbide substrate or a silicon-on-insulator (SOI) substrate, but not limited thereto. For instance, the semiconductor substrate 12 may include a first conductivity type, and a well region 18 including a second conductivity type may be formed on the semiconductor substrate 12 before the hard mask layer 14 is formed, but the present invention is not limited thereto.

In the present embodiment, the first conductivity type is complementary to the second conductivity type. For example, the first conductivity type may be P-type, the second conductivity type may be N-type, and the HV MOS transistor 10 is a PMOS, but those skilled in the art should be aware that the first conductivity type and the second conductivity type can be exchanged and the HV MOS transistor device may be a NMOS, but not limited to those cases described in this embodiment.

In another embodiment, the well region may not be formed in the semiconductor substrate, and the semiconductor substrate should include the first conductivity type. In another embodiment, the semiconductor substrate may include a fin structure (not shown in figures) of a fin field effect transistor (FinFET). The fin structure may be formed by photolithographic etching pattern (PEP) processes or multi patterning processes. Preferably, the fin structure may be formed by a spacer self-aligned double-patterning (SADP) method, in other words, a sidewall image transfer (SIT) method to pattern a bulk silicon substrate or a monocrystalline silicon layer on the surface of the SOI substrate, and forming a fin shape silicon thin film in the bulk silicon substrate or the SOI substrate, but not limited thereto.

In the present embodiment, after forming the well region 18, a first drift region 20 and a second drift region 22 including the first conductivity type (for example, P-type) may be selectively formed in the well region 18 and used for voltage endurance. In the present embodiment, the first drift region 20 and the second drift region 22 may be gradient doped regions with gradient concentration respectively, but the present invention is not limited thereto, the first drift region 20 and the second drift region 22 may be only lightly dope regions. After that, a plurality of insulation structures 24A, 24B, 26A and 26B may be selectively formed in the semiconductor substrate 12 respectively. In this embodiment, the insulation structures 24A and the insulation structures 26A are formed at an outer side of the first drift region 20 and an outer side of the second drift region 22, so that the first drift region 20 and the second drift region 22 are located between the insulation structure 24A and the insulation structure 26A, and the insulation structure 24A and the insulation structure 26A may be used for electrically insulating the HV MOS transistor 10 from other devices in the semiconductor substrate 12. Besides, the insulation structure 24B is disposed in the first drift region 20, and the insulation structure 26B is disposed in the second drift region 22, so as to provide the electronic drift path. In the present embodiment, the insulation structure 24A and 24B may contact the first drift region 20, and the insulation structure 26A and 26B may contact the second drift region 22. In addition, the insulation structure 24A, 24B, 26A and 26B may be shallow trench isolation (STI) structures respectively, but not limited thereto, the insulation structure may be other types of structures as well.

Before the hard mask layer 14 is formed, a pad oxide layer 13 may be formed on the well region 18, the first drift region 20 and the second drift region 22. The pad oxide layer 13 can be formed through a thermal oxidation process. Therefore, in this embodiment, the pad oxide layer 13 is only formed on the silicon-base substrate, but not be formed on the insulation structure 24A, 24B, 26A and 26B, but not limited thereto. In another case of the present invention, the pad oxide layer 13 can be formed through a deposition process, and the pad oxide layer 13 will covers the substrate 12 entirely. It should also be within the scope of the present invention.

Figure 2:
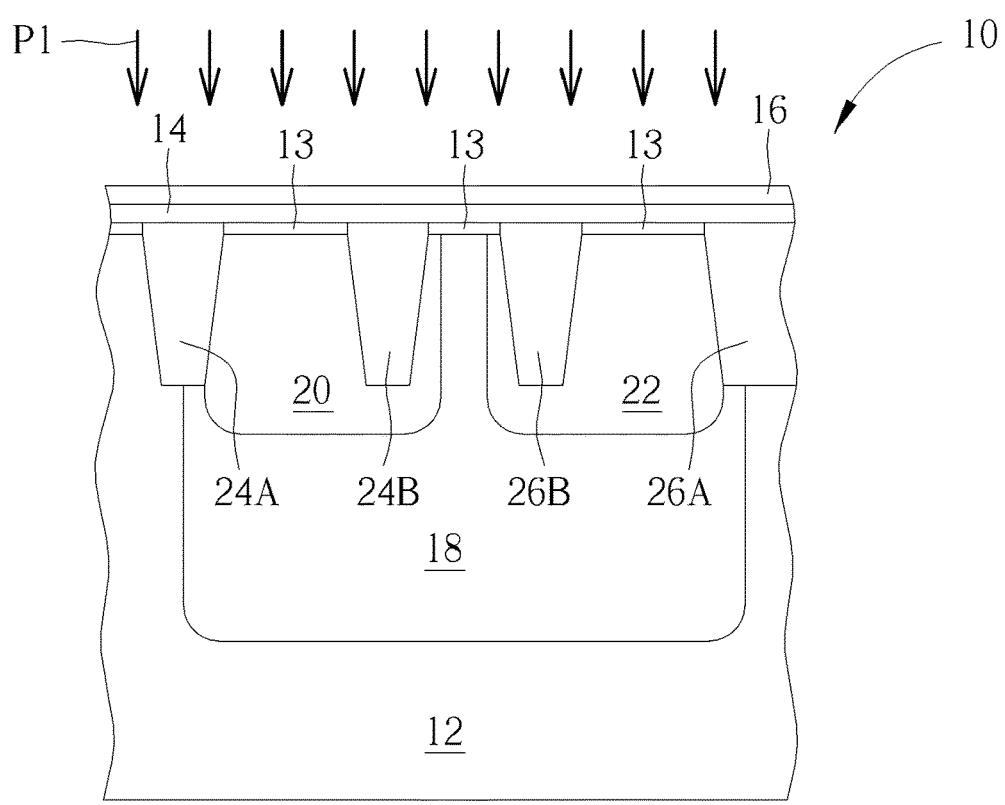

In this embodiment, the hard mask layer 14 may include a silicon nitride layer. After the hard mask layer 14 is formed, as shown in FIG. 2, an oxygen plasma treatment P1 is performed to the top surface of the hard mask layer 14, so as to form an oxide layer 16 on the hard mask layer 14. The purpose of forming the oxide layer 16 is that since a photoresist layer (not shown) will be formed on the hard mask layer 14 in the subsequent steps, according to the results of the applicant's experiment, it is found that the hydrophobicity of the top surface of the hard mask layer 14 is relative high, so that the photoresist layer is not easily coated uniformly on the top surface of the hard mask layer 14. In this embodiment, an additional oxide layer 16 is formed on the hard mask layer 14. The top surface of the oxide layer 16 has a lower hydrophobicity (i.e. higher hydrophilicity) than the top surface of the hard mask layer 14, so that the photoresist layer is more uniform after coating. In addition, the oxide layer 16 can achieve the function of protection the hard mask layer 14

In one aspect, high hydrophobicity of a surface means that the surface carries more negative charges. Therefore, in the following steps of the present invention, some cleaning processes will be taken to reduce the negative charge on the surface of the oxide layer 16 or the hard mask layer 14 to reduce the hydrophobicity of the surfaces.

Figure 3:
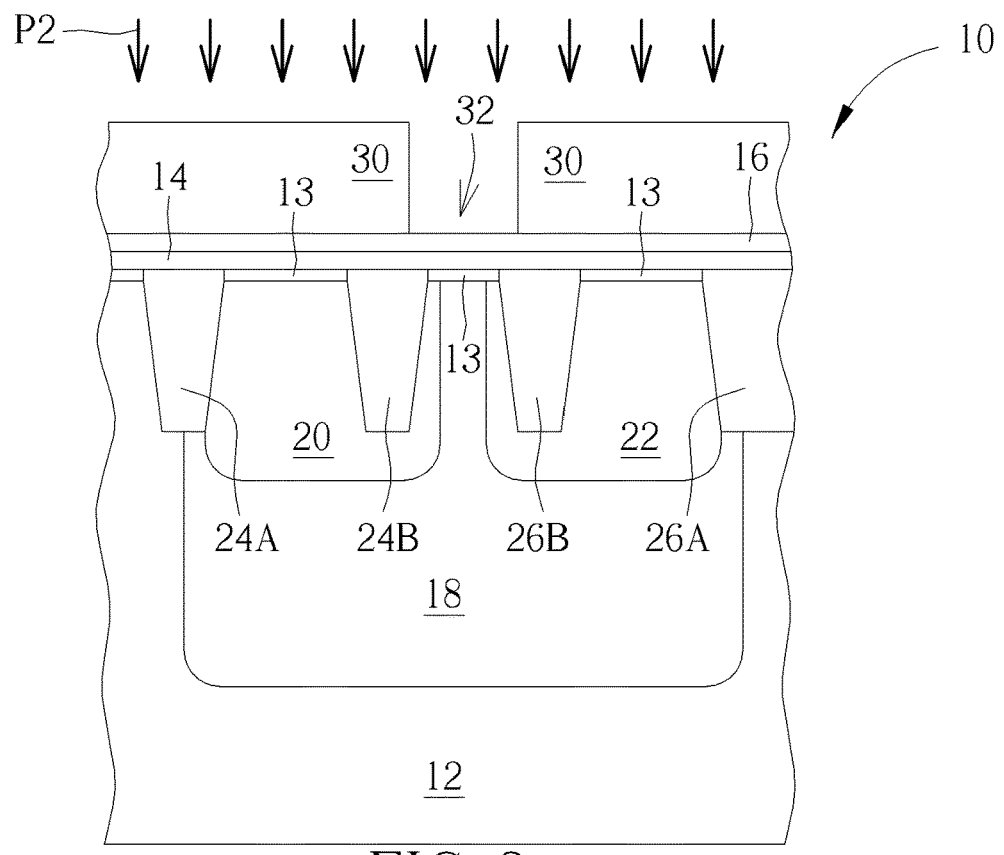

Next, as shown in FIG. 3, a photoresist layer (not shown) is formed on the oxide layer 16, and a photolithography process is then performed, so as to remove parts of the photoresist layer, and to form a patterned photoresist layer 30 on the oxide layer 16. The lithography process includes an exposure step and a development step, wherein after the development of the photoresist layer is completed, except for rinsing the photoresist layer with the developer, the present invention additionally performs a first cleaning process P2, the first cleaning process P2 comprises rinsing the surface of the oxide layer 16 and the patterned photoresist layer 30 with a carbonated water such that the hydrophobicity of the surface of the oxide layer 16 can be further decreased (i.e., the hydrophilicity of the surface of the oxide layer 16 is increased). In other words, the step of cleaning the surface of the component with carbonated water helps to reduce the negative charge on the surface of the component. In this embodiment, the "carbonated water" mentioned comprises deionized water mixed with carbon dioxide gas.

According to the applicant's experimental results, cleaning the surface of the oxide layer 16 and the patterned photoresist layer 30 with carbonated water (deionized water mixed with carbon dioxide) is better than cleaning with deionized water, that is, negative charges on the surface of the oxide layer 16 can be reduced, and the hydrophobicity of the top surface of the oxide layer 16 can be decreased at the same time, this will be beneficial to subsequent processes.

Figure 4:
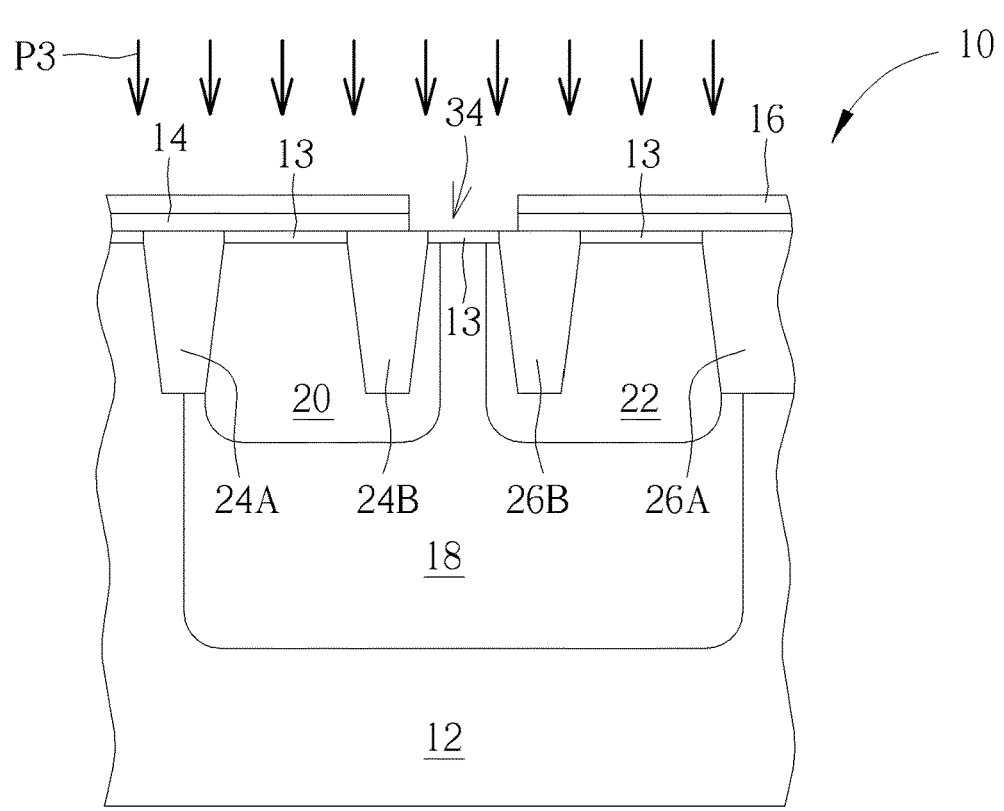

Afterward the photolithography process is performed, a first trench 32 is formed, and the position of the first trench 32 corresponds to a position where a high voltage gate which is subsequently formed. Afterwards, as shown in FIG. 4, an etching process P3 is performed, and the patterned photoresist layer 30 is used as a mask layer, to remove parts of the hard mask layer 14 and to form a second trench 34. In one embodiment, the second trench 34 exposes the pad oxide layer 13, but not limited thereto. In this embodiment, the etching process P3 may include a dry-etching process, such as a reactive ion etching (ME) process. In some embodiment of the present invention, the patterned photoresist layer 30 may be removed during the etching process P3, or in another embodiment of the present invention, the patterned photoresist layer 30 may be removed after parts of the hard mask layer 14 is removed through another etching process.

Regarding the method for etching the hard mask layer 14 and the method for removing the photoresist layer 30 mentioned above, for example, a suitable etching method such as dry etching or wet etching may be used, the techniques are well-known in the art, and will not be further described herein.

Figure 5:
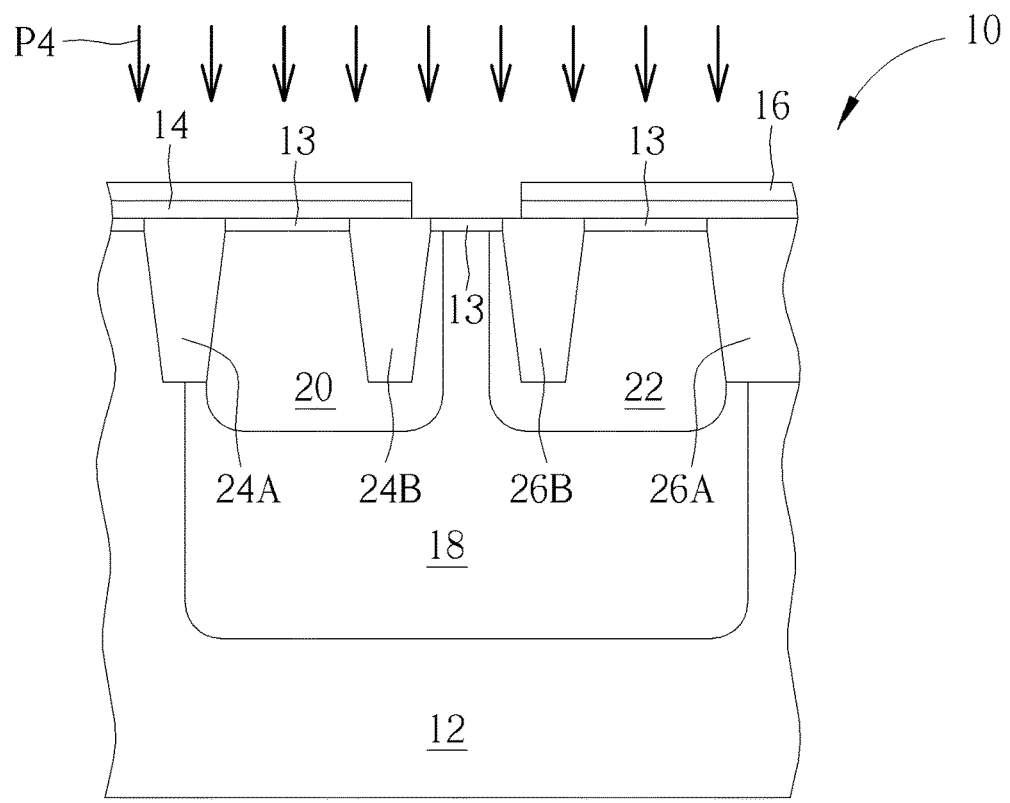

Next, as shown in FIG. 5, a second cleaning process P4 is performed, in this embodiment, the second cleaning process P4 comprises rinsing the top surface of the oxide layer 16 with deionized water for more than 600 seconds. It should be note that in the present invention, the first cleaning process P2 and second cleaning process P4 are different steps, the first cleaning process P2 is performed after the patterned photoresist layer 30 is formed, more detail, the first cleaning process P2 is performed after the photoresist layer 30 is developed. On the other hand, the second cleaning process P4 is performed after the patterned photoresist layer 30 is removed. The purpose of performing the second cleaning process P4 is also to reduce the negative charges content of the surface of the oxide layer 16, thereby reducing the hydrophobicity of the surface of the oxide layer 16. Besides, in some embodiments of the present invention, the second cleaning process P4 may be omitted, it should also be within the scope of the present invention.

The purpose of performing the first cleaning process P2 and the second cleaning process P4 is to reduce the hydrophobicity of the top surface of the oxide layer 16. According to the applicant's experimental results, in the subsequent dipping in the diluted HF (DHF) solution for etching, if the hydrophobicity of the top surface of the oxide layer 16 still high, after the etching process is performed, the DHF solution will form the droplets on the surface of the oxide layer 16 or on the hard mask layer 14. Since these droplets are small and are not easily removed in subsequent cleaning steps, the droplets will be remained on the surface of the hard mask layer 14, thereby affecting the yield of subsequent processes.

Figure 6:
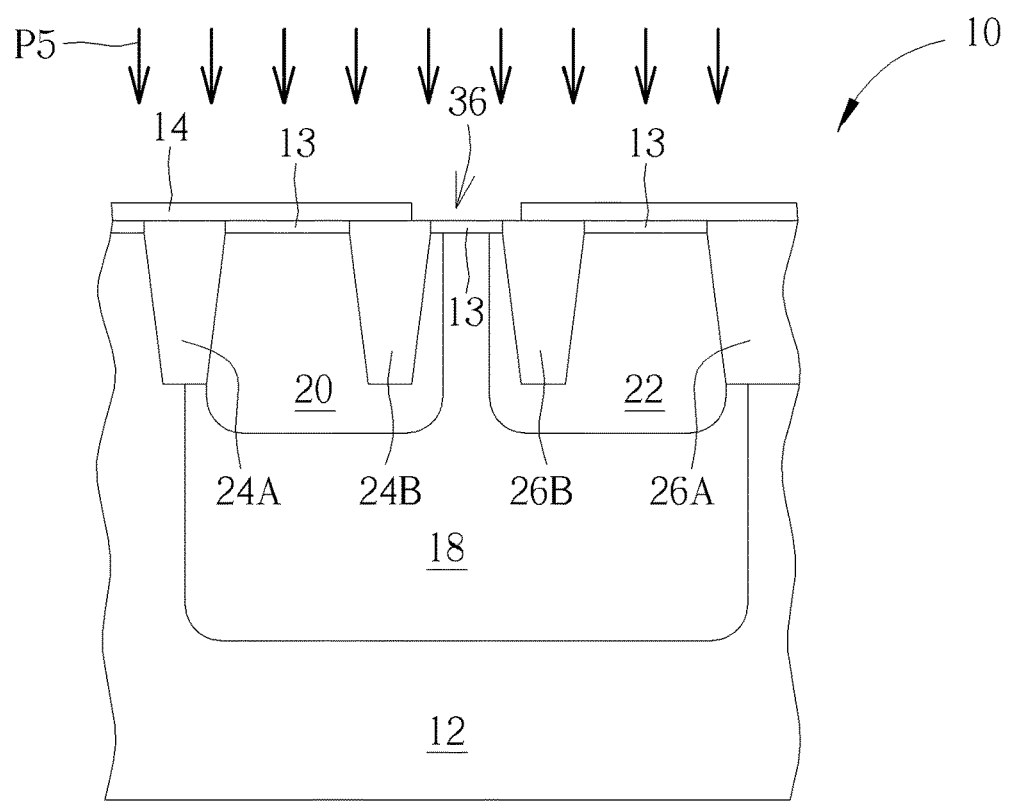

As shown in FIG. 6, an etching process P5 is performed, to remove the oxide layer 16 and parts of the pad oxide layer 13 in the second trench 34, and a third trench 36 is then formed, wherein the third trench 36 exposes the well region 18. In this embodiment, the etching process P5 comprises a wet etching process, such as dipping the semiconductor component in DHF solution. As mentioned above, since the hydrophobicity of the top surface of the oxide layer 16 can be decreased by the first cleaning process P2 and the second cleaning process P4 in sequence, therefore, the DHF solution can be uniformly attached to the surface of the oxide layer 16 for etching. Besides, in this embodiment, the execution time of the etching process P5 is less than 480 seconds, that is, the time for dipping the semiconductor component in the DHF solution is less than 480 seconds, to avoid over-etching and damaging the surface of the hard mask layer 14, and to avoid the hydrophobicity of the surface of the hard mask layer 14 increased again during dipping in the DHF solution (because the HF solution comprises negative charges, therefore, the longer the immersion in the DHF solution, the more negative the surface of the semiconductor component will be, and the more hydrophobic the surface of the semiconductor component will be).

Figure 7:
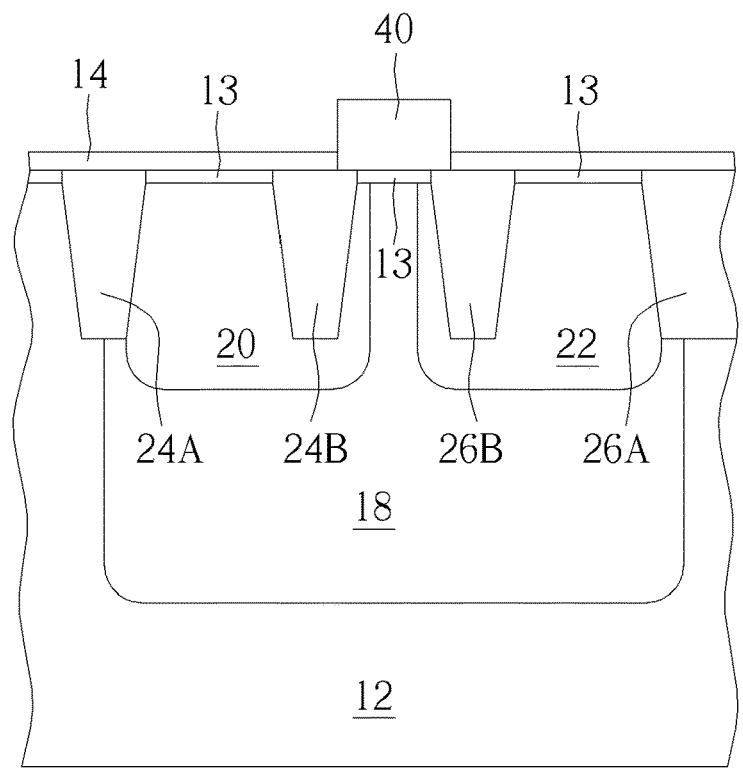

Finally, as shown in FIG. 7, after the etching process P5 is performed, the surface of the hard mask layer 14 can be cleaned by a standard clean 1 (SC-1, or APM process) and a standard clean 2 (SC-2, or HPM process) in sequence. And a high-voltage gate (HVG) 40 is then formed in the third trench 36. The HVG 40 may comprise metal gate or polysilicon gate, and a gate dielectric layer (not shown) may be formed between the well region 18 and the HVG 40. In the present invention, the high-voltage gate 40 is used as the gate structure of the HV MOS 10, and other components such as the source/drain region or the contact structures of the HV MOS 10 will be formed in the following steps. Since these components and manufacturing methods thereof are well known in the art, therefore, the components and the manufacturing method thereof are not described herein.

The following description will detail the different embodiments of the HV MOS transistor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
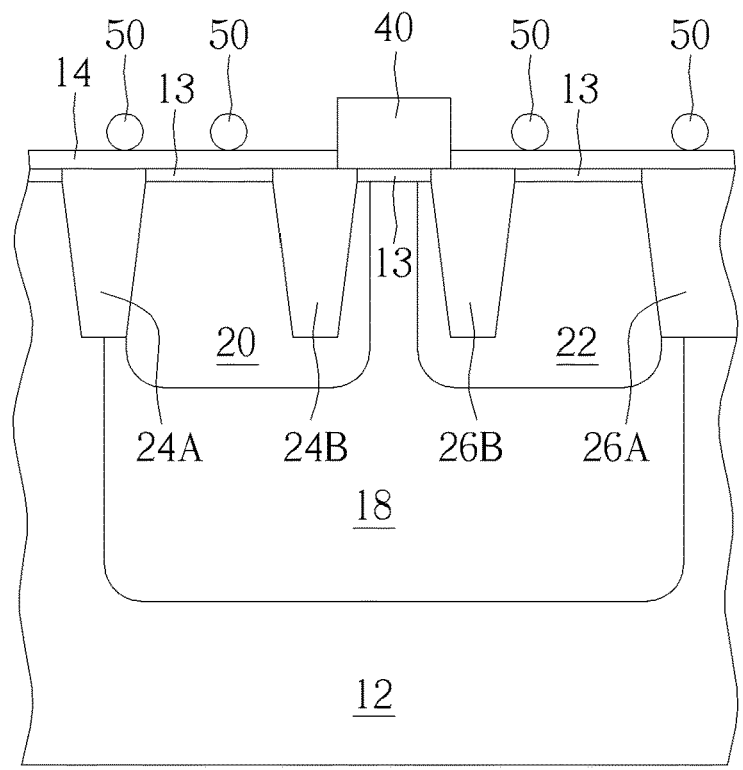
FIGS. 8-9 are cross-sectional view diagrams illustrating the HV MOS transistor device according to another embodiment of the present invention.
Figure 9:
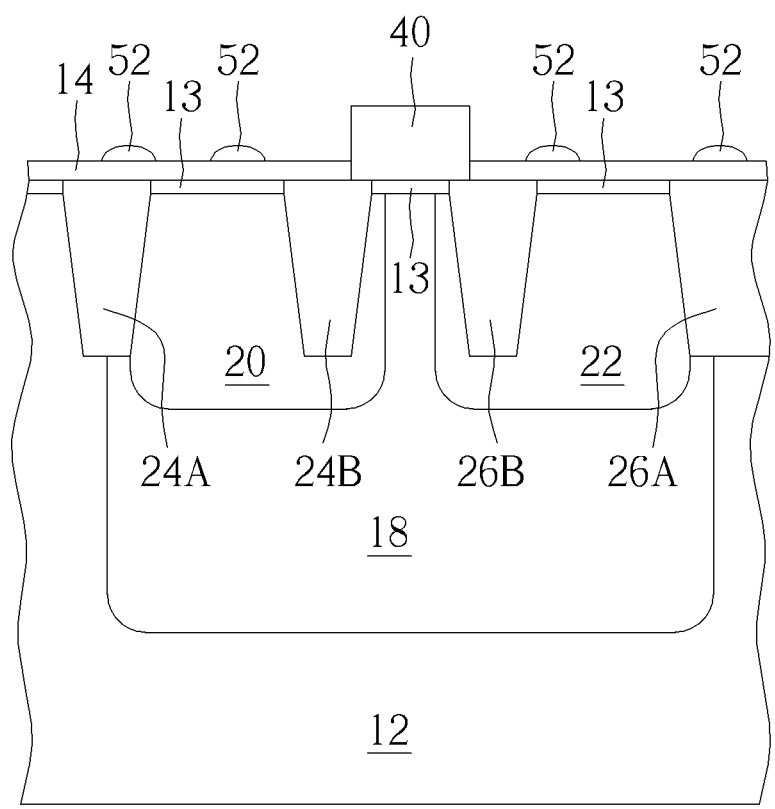

FIGS. 8-9 are cross-sectional view diagrams illustrating the HV MOS transistor device according to another embodiment of the present invention. In this embodiment, if some of the steps in the first embodiment are omitted, the surface of the semiconductor component (such as the surface of the hard mask layer 14 or the oxide layer 16) is highly hydrophobic. When the DHF etching is completed, the applicant founds that there will be a part of the DHF droplets 50 remained on the surface of the semiconductor component, which causes the uneven distribution solution issue.

As shown in FIG. 9, since the DHF droplets 50 comprise a relatively high concentration of oxide material or silicon, in the subsequent step, after the DHF droplets are evaporated, a part of the masking material 52 (for example, oxide or silicon oxide) will be remained on the surface of the semiconductor component, which affects the quality of the semiconductor component.

In summary, in the present invention, a method for improving the quality of a high-voltage metal oxide semiconductor (HV MOS) is provided. Specifically, the present invention provides a method of improving the surface quality of a dielectric layer (i.e. the hard mask layer 14) before the high voltage gate (HVG) 40 is formed. More detail, the method of the present invention performs the first oxygen plasma treatment P1 (to form an oxide layer), the first cleaning process P2 (rinsing with carbonated water), the second cleaning process P4 (rinsing with deionized water) and the etching process P5 (dipping in the DHF solution, and reduce the dipping time to less than 480 seconds) in sequence, therefore, the negative charges on the exposed surface of the semiconductor component is gradually reduced during the execution of the above steps. As a result, after the DHF etching, the problem of uneven distribution of the residual solution on the semiconductor surface can be avoided, thereby improve the quality of the HV MOS.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for improving the quality of a high-voltage metal oxide semiconductor (HV MOS), comprising:
providing a substrate;
forming a hard mask layer on the substrate;
performing an oxygen plasma treatment to the hard mask layer, so as to form an oxide layer on the hard mask layer;
forming a patterned photoresist layer on the oxide layer;
performing a first cleaning process to a top surface of the oxide layer after the patterned photoresist layer is formed, wherein the first cleaning process comprises rinsing the oxide layer with carbonated water;

performing a first etching process to remove parts of the hard mask layer and parts of the oxide layer;

removing the patterned photoresist layer; and performing a second etching process, to remove the oxide layer.

2. The method for improving the quality of a high-voltage metal oxide semiconductor (HV MOS) of claim 1, wherein the substrate comprise a first conductivity type.

3. The method for improving the quality of a high-voltage metal oxide semiconductor (HV MOS) of claim 2, further comprising forming a well region in the substrate, wherein the well region comprises a second conductivity type, and the second conductivity type which is complementary to the first conductivity type.

4. The method for improving the quality of a high-voltage metal oxide semiconductor (HV MOS) of claim 3, further comprising forming two drift regions in the substrate, wherein parts of the well region is disposed between the two drift regions, and wherein the two drift regions comprise the first conductivity type.

5. The method for improving the quality of a high-voltage metal oxide semiconductor (HV MOS) of claim 4, further comprising forming at least one isolation structure in one or two of the drift regions.

6. The method for improving the quality of a high-voltage metal oxide semiconductor (HV MOS) of claim 3, further comprising forming a pad oxide layer between the hard mask layer and the well region, and parts of the pad oxide layer is removed after the second etching process is performed.

7. The method for improving the quality of a high-voltage metal oxide semiconductor (HV MOS) of claim 3, further comprising forming a high voltage gate on the well region after the second etching process is performed.

8. The method for improving the quality of a high-voltage metal oxide semiconductor (HV MOS) of claim 1, wherein the carbonated water comprise deionized water mixed with carbon dioxide gas.

9. The method for improving the quality of a high-voltage metal oxide semiconductor (HV MOS) of claim 1, further comprising performing a second cleaning process to the top surface of the oxide layer after the patterned photoresist layer is removed.

10. The method for improving the quality of a high-voltage metal oxide semiconductor (HV MOS) of claim 9, wherein the second cleaning process comprises rising the oxide layer with deionized water for more than 600 seconds.

11. The method for improving the quality of a high-voltage metal oxide semiconductor (HV MOS) of claim 10, wherein after the second cleaning process is performed, the top surface of the hydrophobicity of the top surface of the oxide layer is decreased.

12. The method for improving the quality of a high-voltage metal oxide semiconductor (HV MOS) of claim 1, wherein the second etching process comprises dipping the substrate in a diluted HF (DHF) solution for less than 480 seconds.

13. The method for improving the quality of a high-voltage metal oxide semiconductor (HV MOS) of claim 1, wherein after the oxide layer is formed on the hard mask layer, the hydrophobicity of the top surface of the oxide layer is lower than the hydrophobicity of a top surface of the hard mask layer.

14. The method for improving the quality of a high-voltage metal oxide semiconductor (HV MOS) of claim 1, wherein after the first cleaning process is performed, the top surface of the hydrophobicity of the top surface of the oxide layer is decreased.

* * * * *